United States Patent
Nam et al.

(10) Patent No.: US 11,724,236 B2
(45) Date of Patent: Aug. 15, 2023

(54) SYSTEM AND METHOD FOR FLUID PREPARATION

(71) Applicant: XIA TAI XIN SEMICONDUCTOR (QING DAO) LTD., Qingdao (CN)

(72) Inventors: Chang-Hyeon Nam, Singapore (SG); Hong-Sik Shin, Singapore (SG); Injoon Yeo, Singapore (SG)

(73) Assignee: XIA TAI XIN SEMICONDUCTOR (QING DAO) LTD., Qingdao (CN)

( * ) Notice: Subject to any disclaimer, the term of this patent is extended or adjusted under 35 U.S.C. 154(b) by 661 days.

(21) Appl. No.: 16/668,416

(22) Filed: Oct. 30, 2019

(65) Prior Publication Data

US 2020/0197882 A1    Jun. 25, 2020

Related U.S. Application Data

(60) Provisional application No. 62/782,386, filed on Dec. 20, 2018.

(51) Int. Cl.
*B01F 3/08*    (2006.01)
*B01F 15/00*   (2006.01)
*B01F 15/04*   (2006.01)
*B01F 23/40*   (2022.01)
*B01F 35/83*   (2022.01)
*B01F 35/21*   (2022.01)
*H01L 21/02*   (2006.01)

(52) U.S. Cl.
CPC .......... *B01F 23/49* (2022.01); *B01F 35/2111* (2022.01); *B01F 35/83* (2022.01); *H01L 21/02041* (2013.01)

(58) Field of Classification Search
CPC ... H01L 21/67017; B01F 23/49; B01F 23/451
See application file for complete search history.

(56) References Cited

U.S. PATENT DOCUMENTS 8,997,776 B2 *  4/2015  Yamauchi .............. B05B 15/55
                                                       137/240
2015/0357208 A1 * 12/2015 Toyomasu ........ H01L 21/67051
                                                       134/57 R

FOREIGN PATENT DOCUMENTS

JP          2002282672 A    10/2002

* cited by examiner

*Primary Examiner* — Elizabeth Insler
(74) *Attorney, Agent, or Firm* — ScienBiziP, P.C.

(57) ABSTRACT

A fluid preparation system includes a tank, a chemical supply line, a mixer, and a deionized (DI) water supply line. The tank contains a first chemical solution. The chemical supply line is coupled to the tank and configured to supply the first chemical solution. The mixer is coupled to the tank. The DI water supply line is coupled to the mixer and configured to supply DI water. The first chemicals solution and the DI water are mixed at the mixer to generate a second chemical solution.

9 Claims, 8 Drawing Sheets

SYSTEM AND METHOD FOR FLUID PREPARATION

CROSS-REFERENCE TO RELATED APPLICATION

The present application claims the benefit of U.S. Provisional Patent Application Ser. No. 62/782,386, filed on Dec. 20, 2018, the entirety of which is hereby incorporated fully by reference.

FIELD

The present disclosure relates to a system and method for fluid preparation, and more particularly, to an improvement in chemical supplying and mixing for semiconductor cleaning process.

BACKGROUND

In the semiconductor industry, various types of chemical are used in semiconductor manufacturing processes (e.g., etching process, deposition process, and cleaning process). In the cleaning process, chemicals such as hydrogen fluoride (HF), buffered oxide etch (BOE) solution, or mixture of HF and ammonium fluoride ($NH_4F$) (also known as LAL solution) are commonly used to remove contaminants (e.g., oxide, metal) from wafers. The mixing ratios of the chemical(s) may vary according to a requirement of each action in the cleaning process.

However, the investment in fluid preparation system has become increasingly heavy due to a complexity of the cleaning process. Accordingly, there is a need for improvements to the fluid preparation system to simplify a construction of the fluid preparation system and save facility space.

SUMMARY

The present disclosure provides systems for fluid preparation and is directed to improving chemical supplying and mixing for semiconductor cleaning process.

In a first aspect of the present disclosure, a fluid preparation system includes a tank, a chemical supply line, a mixer, and a deionized (DI) water supply line. The tank contains a first chemical solution. The chemical supply line is coupled to the tank and configured to supply the first chemical solution. The mixer is coupled to the tank. The DI water supply line is coupled to the mixer and configured to supply DI water. The first chemical solution and the DI water are mixed at mixer to generate a second chemical solution.

In various implementations of the first aspect of the present disclosure, the fluid preparation system further includes a DI water flow meter coupled to the DI water supply line.

In various implementations of the first aspect of the present disclosure, the fluid preparation system further includes a digital flow control unit coupled to the DI water flow meter. The digital flow control unit is configured to control a flow rate of the DI water into the mixer.

In various implementations of the first aspect of the present disclosure, the first chemical solution includes a water and a chemical mixed at a first mixing ratio. The first mixing ratio is 50:1, 100:1, 200:1, or 1000:1.

In various implementations of the first aspect of the present disclosure, the chemical for the first chemical solution is hydrogen fluoride (HF).

In various implementations of the first aspect of the present disclosure, the chemical for the first chemical solution is ammonium fluoride ($NH_4F$).

In various implementations of the first aspect of the present disclosure, the second chemical solution includes a water and a chemical mixed at a second mixing ratio of 50:1, 100:1, 200:1, or 1000:1.

In various implementations of the first aspect of the present disclosure, the chemical for the second chemical solution is hydrogen fluoride (HF).

In various implementations of the first aspect of the present disclosure, the chemical for the second chemical solution is ammonium fluoride ($NH_4F$).

In various implementations of the first aspect of the present disclosure, a central chemical supply system (CCSS) is coupled to the first chemical supply line. The CCSS is configured to store, release, and control delivery of the first chemical solutions.

In various implementations of the first aspect of the present disclosure, a DI water supply system is coupled to the DI water supply line. The DI water supply system is configured to store, release, and control delivery of the DI water.

In a second aspect of the present disclosure, a fluid preparation system includes a first tank, a second tank, a chemical supply line, a mixer, and a DI water supply line. The first tank contains a first chemical solution. The second tank contains a second chemical solution. The chemical supply line is coupled to the mixer and configured to supply the first chemical solution. The mixer is coupled to the first tank and the second tank. The DI water supply line is coupled to the first tank and configured to supply DI water. The first chemical solution and the DI water are mixed at the mixer to generate the second chemical solution, and the second chemical solution is supplied from the mixer to the second tank.

In various implementations of the second aspect of the present disclosure, the fluid preparation system further includes a DI water flow meter coupled to the DI water supply line.

In various implementations of the second aspect of the present disclosure, the fluid preparation system further includes a digital flow control unit coupled to the DI water flow meter. The digital flow control unit is configured to control a flow rate of the DI water into the mixer.

In various implementations of the second aspect of the present disclosure, the first chemical solution includes a water and a chemical mixed at a first mixing ratio of 50:1, 100:1, 200:1, or 1000:1.

In various implementations of the second aspect of the present disclosure, the chemical for the first chemical solution is hydrogen fluoride (HF).

In various implementations of the second aspect of the present disclosure, the chemical for the first chemical solution is ammonium fluoride ($NH_4F$).

In various implementations of the second aspect of the present disclosure, the second chemical solution includes a water and a chemical mixed at a second mixing ratio of 50:1, 100:1, 200:1, or 1000:1.

In various implementations of the second aspect of the present disclosure, the chemical for the second chemical solution is hydrogen fluoride (HF).

In various implementations of the second aspect of the present disclosure, the chemical for the second chemical solution is ammonium fluoride ($NH_4F$).

In various implementations of the second aspect of the present disclosure, a central chemical supply system (CCSS)

is coupled to the first chemical supply line. The CCSS is configured to store, release, and control delivery of the first chemical solutions.

In various implementations of the second aspect of the present disclosure, a DI water supply system is coupled to the DI water supply line. The DI water supply system is configured to store, release, and control delivery of the DI water.

In a third aspect of the present disclosure, a fluid preparation method includes the actions of: delivering a first chemical solution to a tank from a chemical supply line; delivering the first chemical solution to a mixer from the tank; delivering DI water to the mixer from a DI water supply line; mixing the first chemical solution and the DI water at the mixer; and storing a second chemical solution in a second tank. A DI water flow meter is disposed at the DI water supply line to control the flow rate of the DI water.

In various implementations of the third aspect of the present disclosure, the first chemical solution includes a DI water and a chemical mixed at a first mixing ratio of 50:1, 100:1, 200:1, or 1000:1.

In various implementations of the third aspect of the present disclosure, the second chemical solution is at a second mixing ratio of 50:1, 100:1, 200:1, or 1000:1.

In various implementations of the third aspect of the present disclosure, the chemical is hydrogen fluoride (HF) or ammonium fluoride ($NH_4F$).

In a fourth aspect of the present disclosure, a fluid preparation method includes the actions of: delivering a first chemical solution to a tank from a chemical supply line; delivering the first chemical solution to a mixer from the tank; delivering DI water to the mixer from a DI water supply line; mixing the first chemical solution and the DI water at the mixer; and delivering the second chemical solution to a tool in which a cleaning process (e.g., process for polymer removal, oxide removal, metal removal, or silicon dioxide etching) for a wafer is performed. A DI water flow meter is disposed at the DI water supply line to control the flow rate of the DI water.

In various implementations of the fourth aspect of the present disclosure, the first chemical solution includes a DI water and a chemical mixed at a first mixing ratio of 50:1, 100:1, 200:1, or 1000:1.

In various implementations of the fourth aspect of the present disclosure, the chemical for the first chemical solution is hydrogen fluoride (HF) or ammonium fluoride ($NH_4F$). In yet various implementations of the fourth aspect of the present disclosure, the second chemical solution is at a second mixing ratio of 50:1, 100:1, 200:1, or 1000:1.

In various implementations of the fourth aspect of the present disclosure, the chemical for the second chemical solution is hydrogen fluoride (HF) or ammonium fluoride ($NH_4F$).

BRIEF DESCRIPTION OF THE DRAWINGS

The drawings are directed to a manner in which the recited features of the present disclosure can be understood in detail, and to a more particular description of the disclosure briefly summarized above which may be had by reference to implementations, some of which are illustrated in the drawings. It is to be noted, however, that the drawings illustrate only typical implementations of this disclosure and are therefore not to be considered limiting of its scope, for the disclosure may relate to other equally effective implementations.

Figure 1:
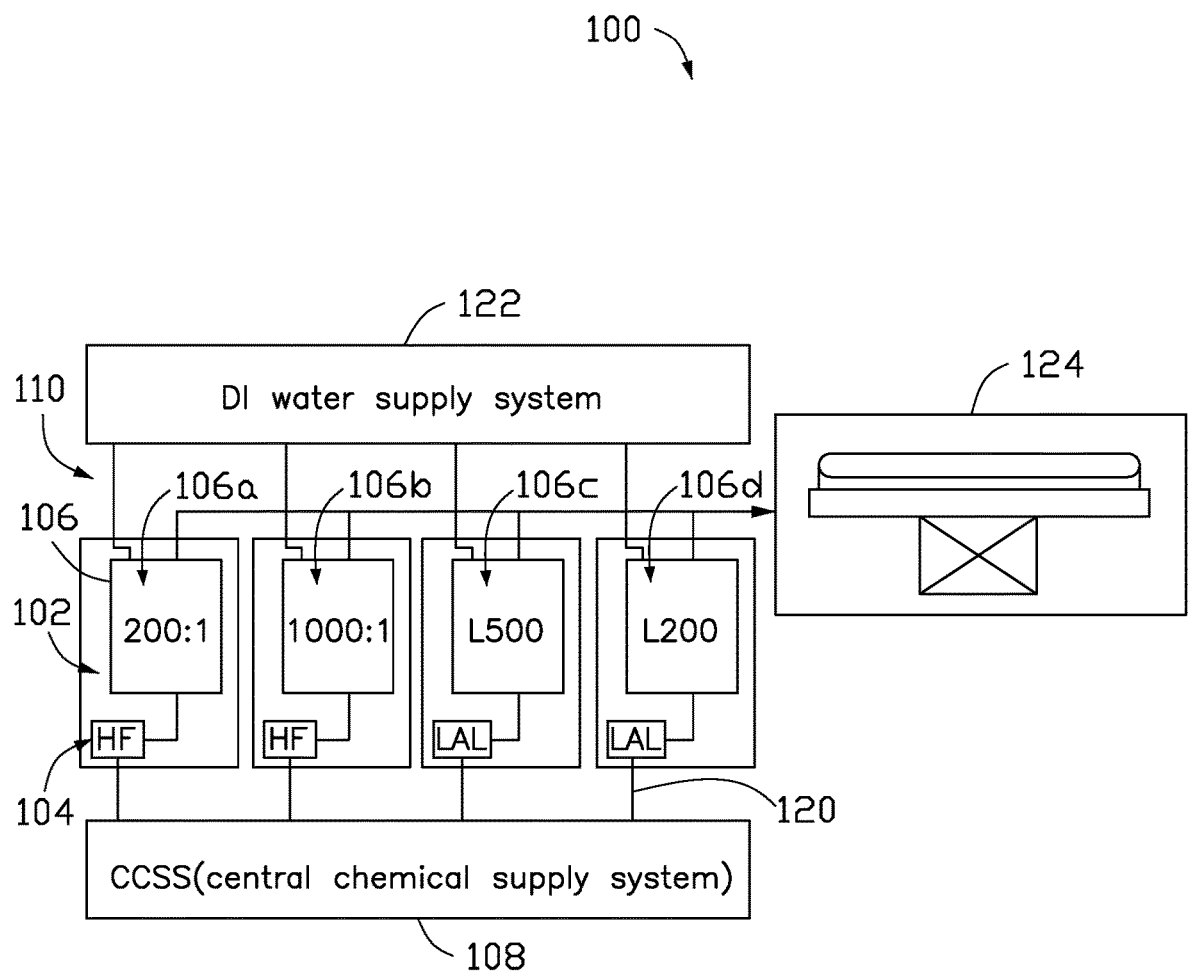
FIG. 1 illustrates a fluid preparation system according to an example implementation of the present application.

It is to be noted, however, that the appended drawings illustrate only example implementations of this disclosure and are therefore not to be considered limiting of its scope, for the disclosure may relate to other equally effective implementations.

It should be noted that these figures are intended to illustrate the general characteristics of methods, structure and/or materials utilized in certain example implementations and to supplement the written description provided below. These drawings are not, however, to scale and may not precisely reflect the precise structural or performance characteristics of any given implementation, and should not be interpreted as defining or limiting the range of values or properties encompassed by example implementations. For example, the relative thicknesses and positioning of layers, regions and/or structural elements may be reduced or exaggerated for clarity. The use of similar or identical reference numbers in the various drawings is intended to indicate the presence of a similar or identical element or feature.

DETAILED DESCRIPTION

The present disclosure will now be described more fully hereinafter with reference to the accompanying drawings, in which example implementations of the disclosure are shown. This disclosure may, however, be implemented in many different forms and should not be construed as limited to the example implementations set forth herein. Rather, these example implementations are provided so that this disclosure will be thorough and complete, and will fully convey the scope of the disclosure to those skilled in the art. Like reference numerals refer to like elements throughout.

The terminology used herein is for the purpose of describing particular example implementations only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, actions, operations, elements, and/or components, but do not preclude the presence or addition of one or more other features, regions, integers, actions, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The description will be made as to the example implementations in conjunction with the accompanying drawings in FIGS. 1 to 8. Reference will be made to the drawing figures to describe the present disclosure in detail, wherein depicted elements are not necessarily shown to scale and wherein like or similar elements are designated by same or similar reference numeral through the several views and same or similar terminology.

FIG. 1 illustrates an implementation of the present disclosure in which a plurality of chemical storage units 102 are used in a fluid preparation system 100. Each of the chemical storage units 102 includes a chemical storage tank 104 and a mixing tank 106. A central chemical supply system (CCSS) 108 is coupled to the chemical storage tanks 104 of the chemical storage units 102 and is configured to store, release, and control delivery of one or more first chemical solutions to the chemical storage tanks 104. In each of the chemical storage units 102, the mixing tank 106 contains a second chemical solution of the first chemical solution released from the chemical storage tank 104 mixing with water supplied from a deionized (DI) water supply line 110 at a predefined mixing ratio.

For example, as illustrated in FIG. 1, the first chemical solutions stored in the CCSS may be HF and a mixture of HF and $NH_4F$ (LAL). Consequently, a solution of $H_2O$ and HF mixed at a ratio of 200:1 may be stored in Tank 106a; a solution of $H_2O$ and HF mixed at a ratio of 1000:1 may be stored in Tank 106b; a solution of $H_2O$ and LAL mixed at a ratio that achieves an etching rate of 500 Å per minute for oxide films (L500) may be stored in Tank 106c; and a solution of $H_2O$ and LAL mixed at a ratio that achieves an etching rate of 200 Å per minute for oxide films (L200) may be stored in Tank 106d.

In the implementation, the chemical storage units 102 are controlled by the CCSS 108, which is configured to control delivery of 1) the first chemical solution from the CCSS 108 to the chemical storage tanks 104 through a plurality of chemical supply lines 120; 2) DI water from the DI water supply lines 110 to the mixing tanks 106 of the chemical storage units 102 through the plurality of DI water supply lines 110 coupled to a DI water supply system 122; and 3) the second chemical solutions from the mixing tanks 106 to a tool 124 in which a cleaning process (e.g., process for polymer removal, oxide removal, metal removal, or silicon dioxide etching) for a wafer is performed.

Figure 2:
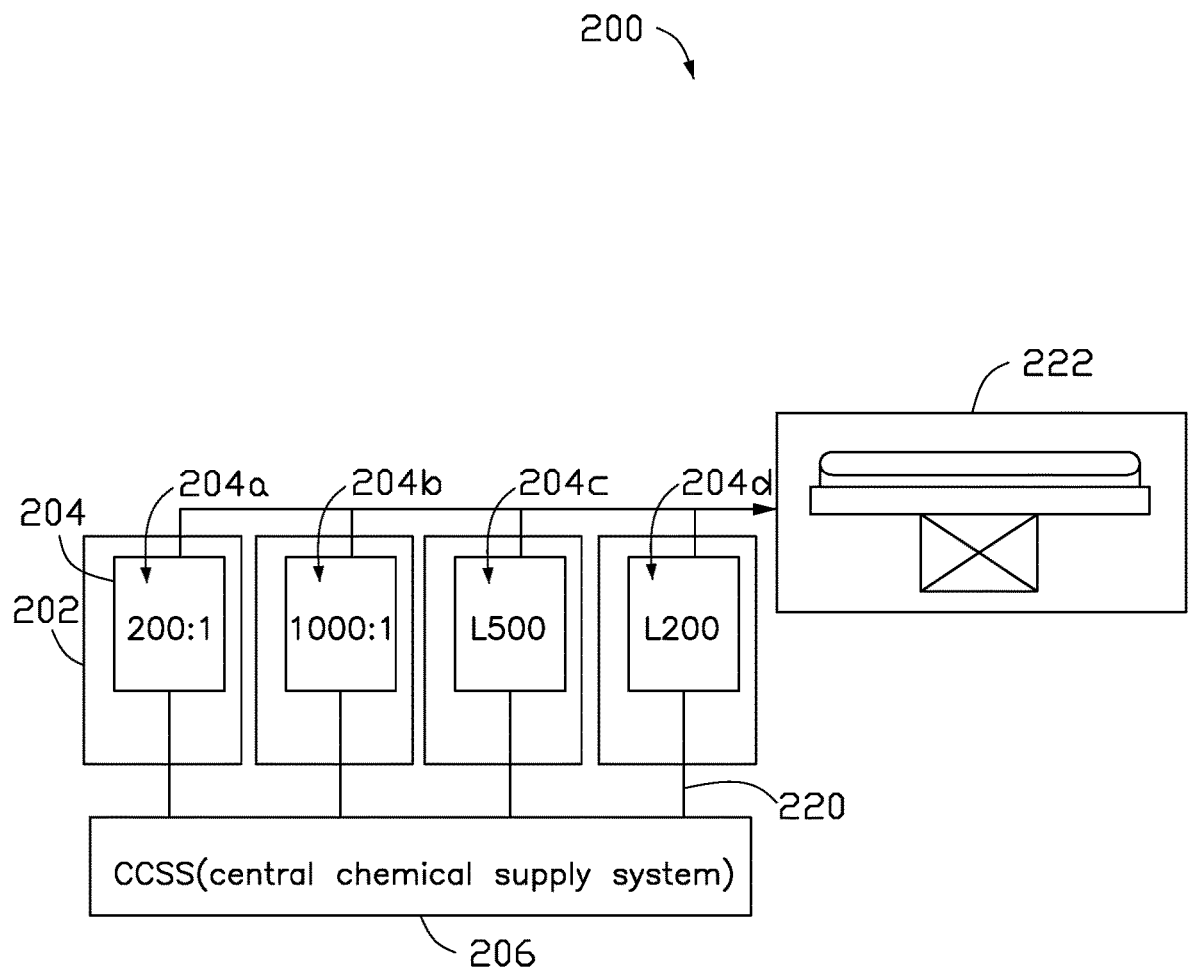
FIG. 2 illustrates a fluid preparation system according to another example implementation of the present application.

FIG. 2 illustrates another implementation of the present disclosure in which a plurality of chemical storage units 202 are used for a fluid preparation system 200. Each of the chemical storage units 202 includes a mixing tank 204. A CCSS 206 is coupled to the chemical storage units 202 and is configured to store, release, and control delivery of one or more first chemical solutions to the mixing tank 204. Each of the chemical storage units 202 contains one of the first chemical solutions released from the CCSS 206 at a predefined mixing ratio.

For example, as illustrated in FIG. 2, the first chemical solutions stored in the CCSS may be a solution of $H_2O$ and HF mixed at a ratio of 200:1, a solution of $H_2O$ and HF mixed at a ratio of 1000:1, a solution of $H_2O$, HF and $NH_4F$ (LAL) mixed at a ratio that achieves an etching rate of 500 Å per minute for oxide films (L500), and a solution of $H_2O$, HF and $NH_4F$ (LAL) mixed at a ratio that achieves an etching rate of 200 Å per minute for oxide films (L200. The solutions may be delivered to and stored in Tanks 204a, 204b, 204c, 204d, respectively.

In the implementation, the chemical storage units 202 are controlled by the CCSS 206, which is configured to control delivery of 1) the first chemical solutions from the CCSS 206 to the mixing tanks 204 of the chemical storage units 202 through a plurality of chemical supply lines 220; and 2) the first chemical solutions from the mixing tanks 204 to a tool 222 for wafer cleaning.

Figure 3:
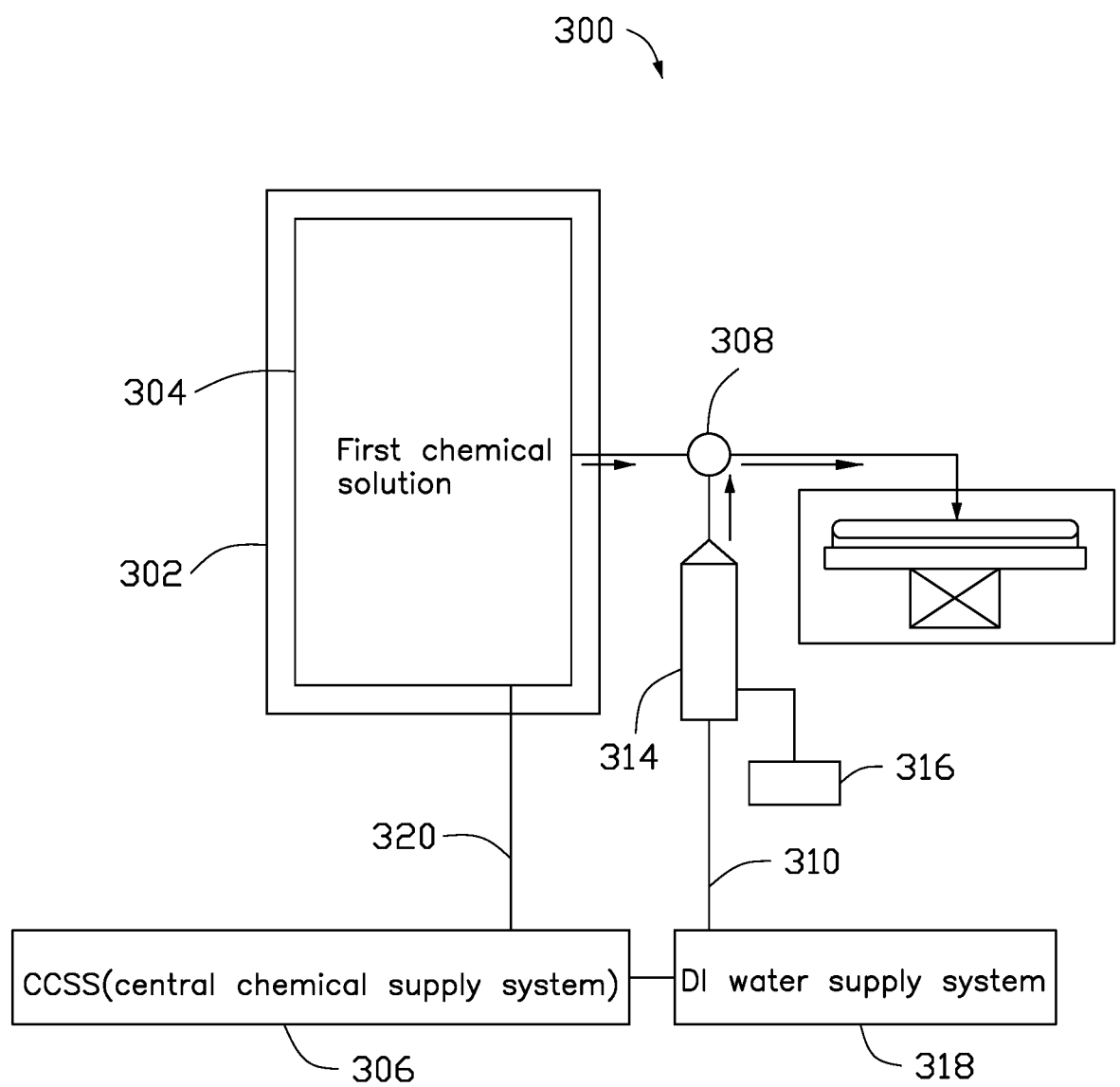
FIG. 3 illustrates a fluid preparation system according to another example implementation of the present application.

As illustrated in FIG. 3, another implementation of the present disclosure provides a fluid preparation system 300 in which a chemical storage unit 302 is employed. A CCSS 306 is coupled to a mixing tank 304 of the chemical storage unit 302 and is configured to store, release, and control delivery of a first chemical solution at a predefined mixing ratio (e.g., mixing ratio A). The mixing tank 304 is configured to store the first chemical solution. The fluid preparation system 300 includes a mixer 308 to which both the mixing tank 304 and a DI water supply line 310 are coupled. The mixer 308 is further coupled to a tool 312 for wafer cleaning and is configured to mix the first chemical solution from the mixing tank 304 with DI water from the DI water supply line 310, which is coupled to a DI water supply system 318. To ensure precision of mixing at the mixer 308, a DI water flow meter 314 may be disposed at the DI water supply line 310 and coupled to a digital flow control unit 316, which is configured to control the flow rate of DI water into the mixer 308. A second chemical solution of the first chemical solution mixed with DI water at another predefined mixing ratio (e.g., mixing ratio B) is generated at the mixer 308 and delivered to the tool 312.

In the implementation, the CCSS 306 is configured to control delivery of 1) the first chemical solutions from the CCSS 306 to the mixing tank 304 of the chemical storage unit 302 through a chemical supply line 320; 2) the DI water from the DI water supply line 310 to the mixer 308; and 3) the first chemical solution from the mixing tank 304 to the mixer 308.

In some implementations, the first chemical solutions stored in the CCSS may be a solution having a mixing ratio A of 50:1 (e.g., $H_2O$ and HF mixed at a ratio of 50:1, or $H_2O$ and $NH_4F$ mixed at a ratio of 50:1). The mixing ratio B of the second chemical solution may be 50:1, 100:1, 200:1, or 1000:1 (e.g., $H_2O$ and HF mixed at a ratio of 50:1, or $H_2O$ and $NH_4F$ mixed at a ratio of 100:1).

In some implementations, the second chemical solution, obtained by mixing the first chemical solution from the mixing tank 304 and the DI water from the DI water supply line 310, may achieves an etch rate for oxide films of 1000 Å per minute (L1000), 700 Å per minute (L700), 500 Å per minute (L500), 300 Å per minute (L300) or 200 Å per minute (L200).

In some implementations, a central gas supply system (CGS) (not shown) may further be connected to the CCSS 306 for supplying gaseous chemicals to the CCSS 306.

Figure 4:
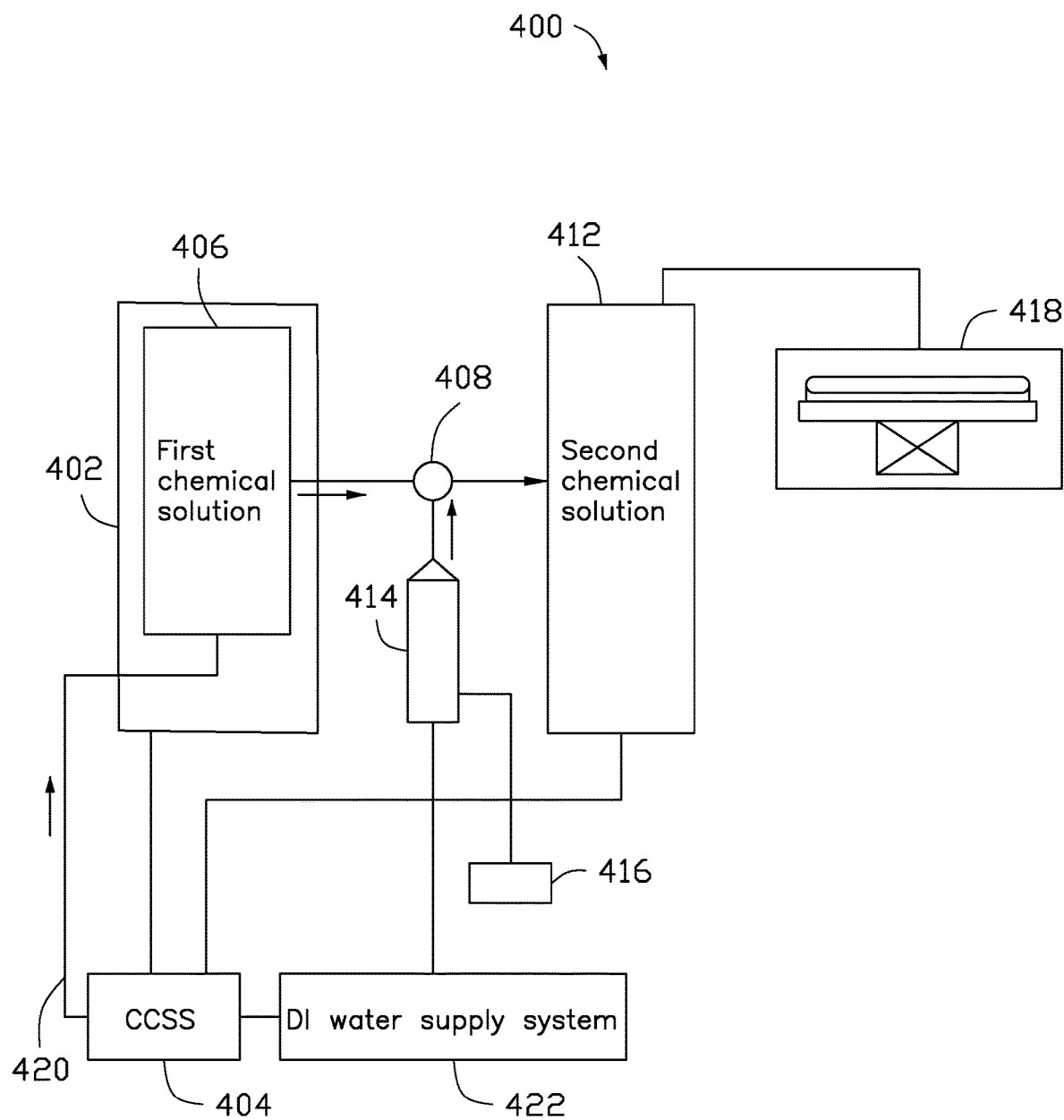
FIG. 4 illustrates a fluid preparation system according to another example implementation of the present application.

As illustrated in FIG. 4, another implementation of the present disclosure provides a fluid preparation system 400 in which one chemical storage unit 402 is employed. A CCSS 404 is coupled to a mixing tank 406 of the chemical storage unit 402 and is configured to store, release, and control delivery of a first chemical solution at a predefined mixing ratio (e.g., mixing ratio C). The mixing tank 406 is configured to store the first chemical solution. The fluid preparation system 400 includes a mixer 408 to which both the mixing tank 406 and a DI water supply line 410 are coupled. The mixer 408 is further coupled to a tank 412 and is configured to mix the first chemical solution from the mixing tank 406 with DI water from the DI water supply line 410, which is coupled to a DI water supply system 422. To ensure precision of mixing at the mixer 408, a DI water flow meter 414 may be disposed at the DI water supply line 410 and coupled to a digital flow control unit 416, which is configured to control the flow rate of DI water into the mixer 408. A second chemical solution of the first chemical solution mixed with DI water at another predefined mixing ratio (e.g., mixing ratio D) is generated at the mixer 408 and stored in the tank 412. The second chemical solution stored in the tank 412 may be delivered to a tool 418 for wafer cleaning.

In the implementation, the CCSS 404 is configured to control delivery of 1) the first chemical solution from the CCSS 404 to the mixing tank 406 of the chemical storage unit 402 through a chemical supply line 420; 2) the DI water from the DI water supply line 410 to the mixer 408; and 3) the second chemical solution from the tank 412 to the tool 418.

In some implementations, the first chemical solutions stored in the CCSS may be a solution having a mixing ratio C of 50:1 (e.g., $H_2O$ and HF mixed at a ratio of 50:1, or $H_2O$ and $NH_4F$ mixed at a ratio of 50:1). The mixing ratio D of the second chemical solution may be 50:1, 100:1, 200:1, or 1000:1 (e.g., $H_2O$ and HF mixed at a ratio of 50:1, or $H_2O$ and $NH_4F$ mixed at a ratio of 100:1).

In some implementations, the second chemical solution, obtained by mixing the first chemical solution from the mixing tank 406 and the DI water from the DI water supply line 410, may achieves an etch rate for oxide films of 1000 Å per minute (L1000), 700 Å per minute (L700), 500 Å per minute (L500), 300 Å per minute (L300) or 200 Å per minute (L200).

Figure 5:
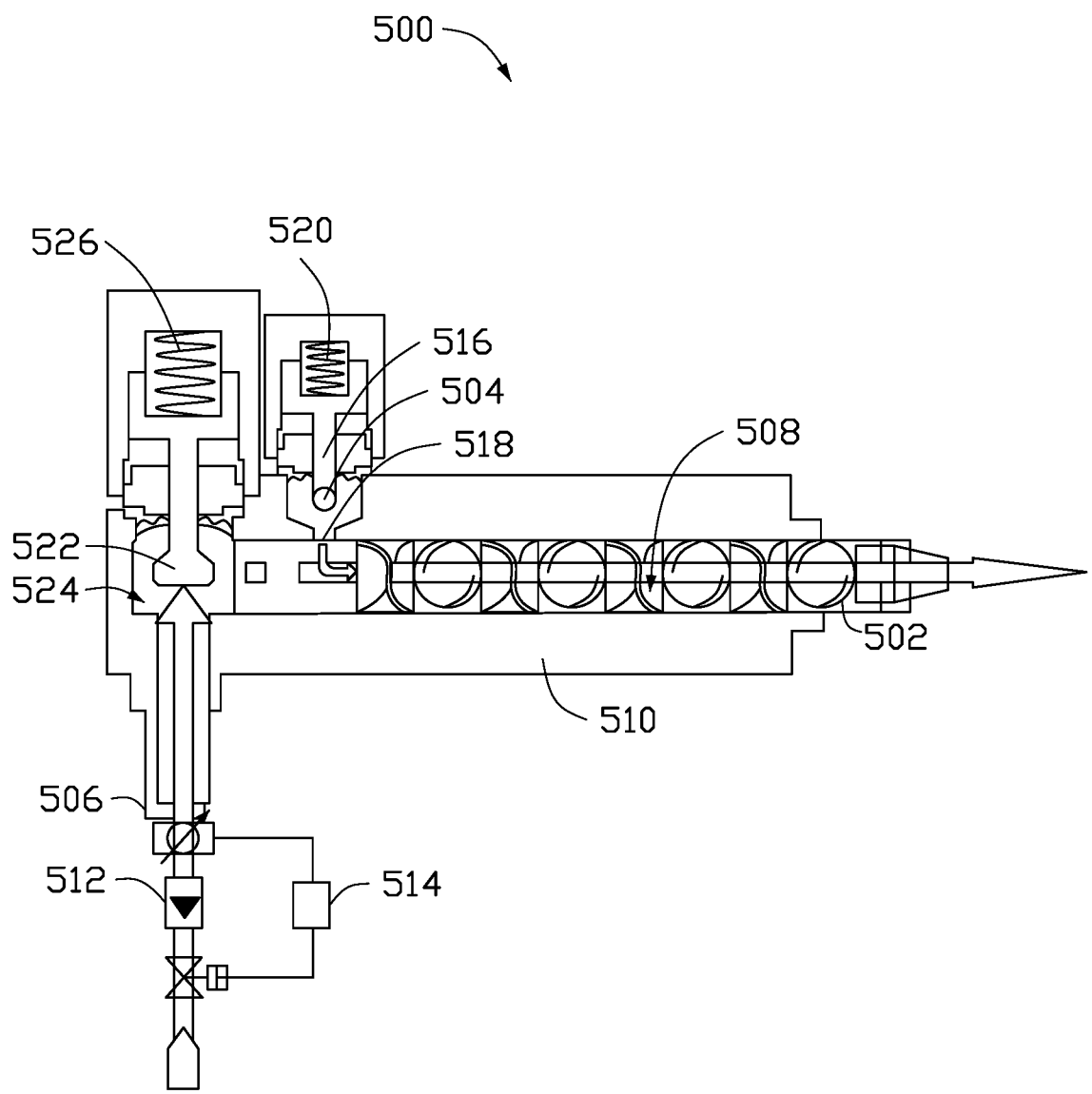
FIG. 5 illustrates a cross-sectional view of a mixer used in the fluid preparation system according to an example implementation of the present disclosure.

FIG. 5 illustrates a mixer 500 used in a fluid preparation system according to an implementation of the present disclosure. The mixer 500 includes an outlet 502 and two inlets 504, 506; the first inlet 504 is configured for delivery of chemical solutions, whereas the second inlet 506 is configured for delivery of DI water. The mixer 500 further includes a main path 510. The front portion of the main path 510 is configured for accommodating the chemical solutions and the DI water delivered from the first inlet 504 and the second inlet 506. The rear portion of the main path 510 includes a static mixing member 508 and is configured to mix the DI water with the chemical solutions. The rear portion of the main path 510 is coupled to the outlet 502.

A flowmeter 512 may be coupled to the second inlet 506 and is configured to measure the flow rate of the DI water. A flow controller 514 may be coupled to the flowmeter 512 and is configured to control the flow rate of the DI water based on the measurement result of the flowmeter 512.

A first piston 516 is coupled a first internal inlet 518 and a first spring 520 that enables the first piston 516 to flexibly move back and forth according to the change of pressure of the chemical solutions flowing into the first internal inlet 518. A second piston 522 is coupled a second internal inlet 524 and a second spring 526 that enables the second piston 522 to flexibly move back and forth according to the change of pressure of the DI water flowing into the second internal inlet 524. The pressure of the DI water is correlated with the flowrate of the DI water as controlled by the flow controller 514.

Figure 6A:
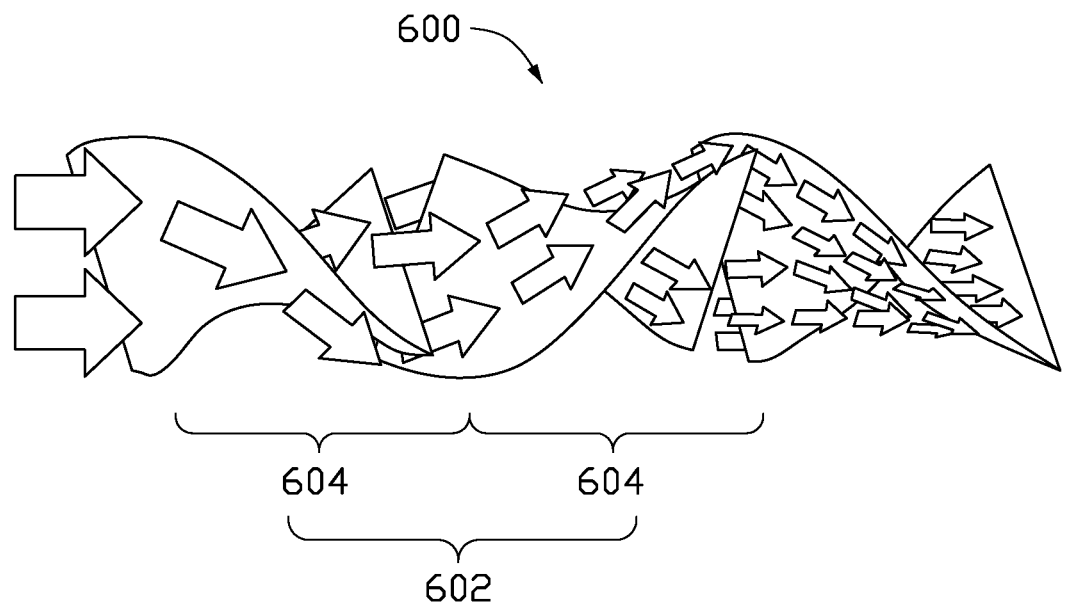
FIG. 6A illustrates a flow division process in a static mixing member of the mixer according to an example implementation of the present application.

In some implementations as illustrated in FIG. 6A, the structure 600 of the static mixing member 508 in the main path 510 of the mixer 500 may include a flow divider by in which a stream of fluid is divided into two equal segments 604 after flowing through an element 602 of the structure 600. Accordingly, the number of segments 604 generated in the static mixing member 508 is $2^n$, where n is the number of elements 602 in the structure 600.

Figure 6B:
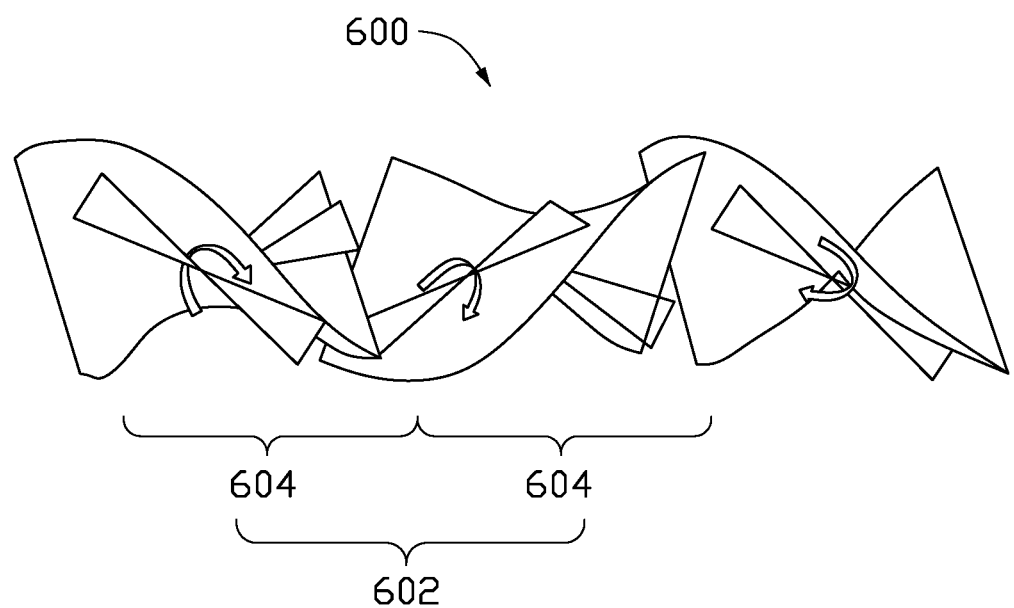
FIG. 6B illustrates a rotation circulation process in a static mixing member of a mixer, according to an example implementation of the present application.

In some implementations as illustrated in FIG. 6B, the structure 600 of the static mixing member 508 in the main path 510 of the mixer 500 may include a rotation circulator by which the rotation direction of the stream of fluid (as indicated by the circular arrows) varies by element 602, resulting in the fluid flowing clockwise and counterclockwise alternatingly in the structure 600.

In some implementations as illustrated in FIG. 6B, the structure 600 of the static mixing member 508 in the main path 510 of the mixer 500 may include a radial mixing processor by which each of the elements 602 of the structure 600 is designed to direct the fluid to flow from the edge of the element 602 toward the center of the element 602 (as indicated by the triangular arrows).

Figure 7:
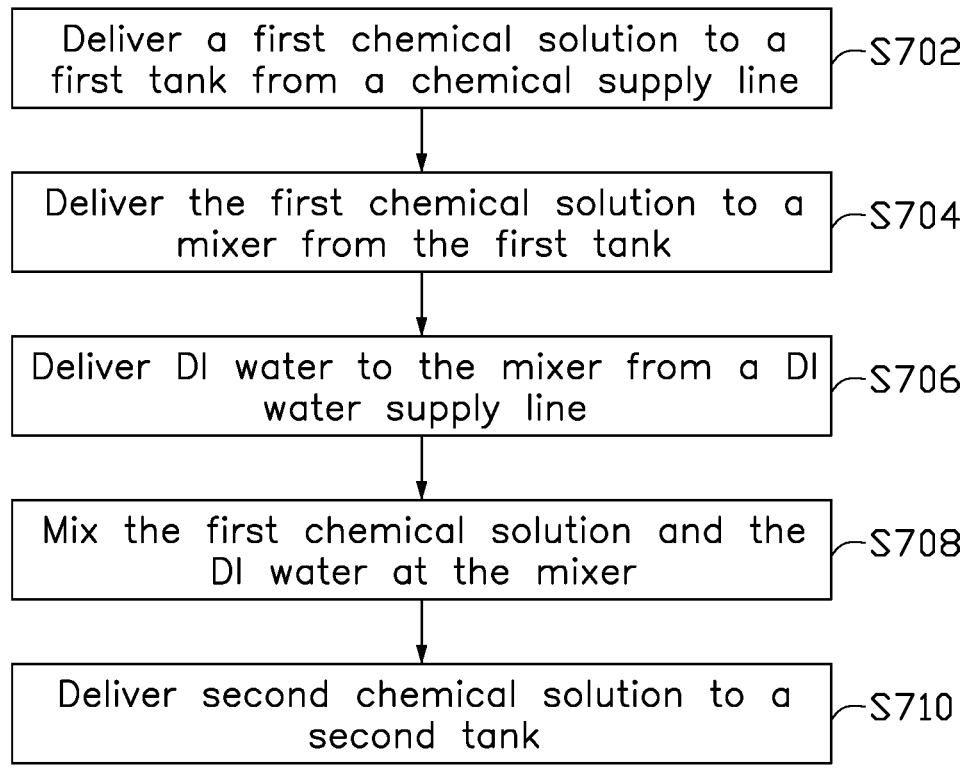
FIG. 7 is a flowchart of a method for fluid preparation according to an example implementation of the present application.

FIG. 7 is a flowchart showing an implementation of a fluid preparation method for supplying and mixing chemical solutions. The fluid preparation method includes actions S702-S710. At action S702, a first chemical solution is delivered to a first tank from a chemical supply line. At action S704, the first chemical solution is delivered to a mixer from the first tank. At action S706, DI water is delivered to the mixer from a DI water supply line. At action S708, the first chemical solution and the DI water are mixed at the mixer to generated a second chemical solution. At action S710, the second chemical solution is stored in a second tank.

In some implementations, the first chemical solution includes DI water and a chemical mixed at a mixing ratio of 50:1, 100:1, 200:1, or 1000:1. The chemical may be hydrogen fluoride (HF) or ammonium fluoride ($NH_4F$).

In some implementations, the second chemical solution may also include DI water and a chemical mixed at a mixing ratio of 50:1, 100:1, 200:1, or 1000:1. The chemical may be hydrogen fluoride (HF) or ammonium fluoride ($NH_4F$).

Figure 8:
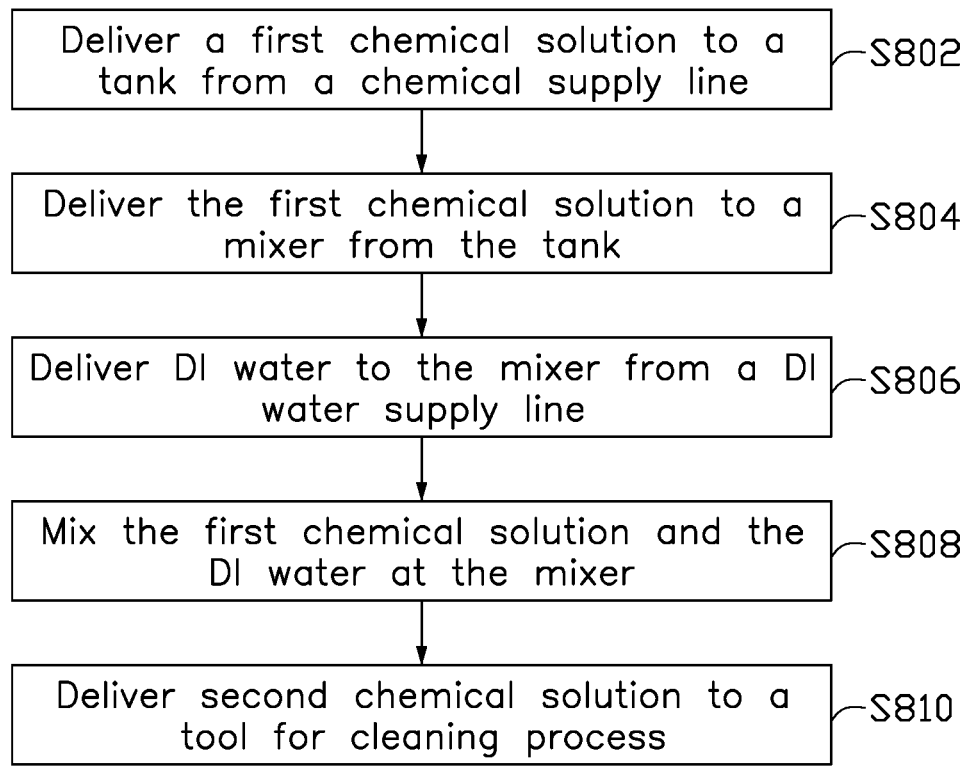
FIG. 8 is a flowchart of a method for fluid preparation according to another example implementation of the present application.

FIG. 8 is a flowchart showing another implementation of a fluid preparation method for supplying and mixing chemicals. The fluid preparation methods includes actions S802-S810. At action S802, a first chemical solution is delivered to a tank from a chemical supply line. At action S804, he first chemical solution is delivered to a mixer from the tank. At action S806, DI water is delivered to the mixer from a DI water supply line. At action S808, the first chemical solution and the DI water are mixed at the mixer to generate a second chemical solution. At action S810, delivering the second chemical solution to a tool.

In some implementations, the first chemical solution includes DI water and a chemical mixed at a mixing ratio of 50:1, 100:1, 200:1, or 1000:1. The chemical for the first chemical solution may be hydrogen fluoride (HF) or ammonium fluoride ($NH_4F$).

In some implementations, the second chemical solution may also include DI water and a chemical mixed at a mixing ratio of 50:1, 100:1, 200:1, or 1000:1. The chemical for the second chemical solution may be hydrogen fluoride (HF) or ammonium fluoride ($NH_4F$).

The implementations shown and described above are only examples. Many details are often found in the art such as the other features of a radiation measurement panel and device. Therefore, many such details are neither shown nor described. Even though numerous characteristics and advantages of the present technology have been set forth in the foregoing description, together with details of the structure and function, the disclosure is illustrative only, and changes may be made in the detail, especially in matters of shape, size, and arrangement of the parts within the principles, up to and including the full extent established by the broad general meaning of the terms used in the claims. It will therefore be appreciated that the implementations described above may be modified within the scope of the claims.

What is claimed is:

1. A fluid preparation system, comprising:
a first tank containing a first chemical solution;
a second tank containing a second chemical solution;
a chemical supply line coupled to the first tank and configured to supply the first chemical solution;
a mixer coupled to the first tank and the second tank, the mixer comprising a first piston, a first spring, a first internal inlet, a second piston, a second spring, and a second internal inlet, the first piston being coupled to the first internal inlet and the first spring, the second piston being coupled to the second internal inlet and the second spring; and
a deionized (DI) water supply line coupled to the mixer and configured to supply DI water,
wherein the first chemical solution and the DI water are mixed by flowing clockwise and counterclockwise alternatingly in a plurality of rotation circulators of the mixer to generate the second chemical solution, and the second chemical solution is supplied from the mixer to the second tank.

2. The fluid preparation system of claim 1, further comprising a DI water flow meter coupled to the DI water supply line.

3. The fluid preparation system of claim 2, further comprising a digital flow control unit coupled to the DI water flow meter, wherein the digital flow control unit is configured to control a flow rate of the DI water into the mixer.

4. The fluid preparation system of claim 1, wherein the first chemical solution comprises a DI water and a chemical mixed at a first mixing ratio of 50:1, 100:1, 200:1, or 1000:1.

5. The fluid preparation system of claim 4, wherein the chemical is hydrogen fluoride (HF) or ammonium fluoride (NH4F).

6. The fluid preparation system of claim 1, wherein the second chemical solution comprises a DI water and a chemical mixed at a second mixing ratio of 50:1, 100:1, 200:1, or 1000:1.

7. The fluid preparation system of claim 6, wherein the chemical is hydrogen fluoride (HF) or ammonium fluoride (NH4F).

8. The fluid preparation system of claim 1, further comprising a central chemical supply system (CCSS) coupled to the chemical supply line, wherein the CCSS is configured to store, release, and control delivery of the first chemical solution.

9. The fluid preparation system of claim 1, further comprising a DI water supply system coupled to the DI water supply line, wherein the DI water supply system is configured to store, release, and control delivery of the DI water.

* * * * *